Sept. 30, 1969 C. E. WHITFIELD 3,470,043

SELECTIVE PLATING OF ETCHED CIRCUITS WITHOUT
REMOVING PREVIOUS PLATING
Filed Sept. 8, 1965

INVENTOR
Charles E. Whitfield

BY

ATTORNEYS

United States Patent Office 3,470,043
Patented Sept. 30, 1969

3,470,043

SELECTIVE PLATING OF ETCHED CIRCUITS WITHOUT REMOVING PREVIOUS PLATING

Charles Exum Whitfield, Baltimore, Md., assignor to the United States of America as represented by the Administrator of the National Aeronautics and Space Administration Filed Sept. 8, 1965, Ser. No. 485,958
Int. Cl. C23f *1/02*
U.S. Cl. 156—3 7 Claims

ABSTRACT OF THE DISCLOSURE

A process for fabricating, by a multi-step procedure, an etched copper circuit board wherein discrete portions (conductor paths, terminal pads, etc.) thereof are covered with a suitable metal coating. In the case where it is desirable to have the conductor paths coated with gold and the terminal pads coated with solder plate: (1) a resist covered copper board is photographed under a positive film of the conductor paths, developed to bare the conductor path portions of the copper layer, plated with gold on the exposed copper layer, and processed to reprove the resist; (2) the board is again completely coated with resist, photographed under a positive film of the terminal pads, developed to expose only the terminal pads, plated with solder plate on the terminal pads, and processed to remove the resist; and (3) the board for a final time is completely covered with resist, photographed under a negative of the overall circuit, developed so that the unprotected copper is etched away, and processed to remove the resist.

The invention described herein may be manufactured and used by or for the Government of the United States of America for governmental purposes without the payment of any royalties thereon or therefor.

This invention relates to a procedure for fabricating an etched copper circuit board.

Etched copper circuit boards whose employment has become widespread in recent years offers the art a high degree of reliability and inexpensive fabrication. These circuit boards are used extensively in the electronic circuitry of television, radio, telephone, and aerospace equipment.

Typically the starting point in preparation of etched copper circuit boards is art work, e.g., a 4:1 black tape replica of the entire circuit layed out on a transparent film (suitably Mylar). Then the art work is reproduced photographically as a positive film. Next a copper-clad board (the board usually being an epoxy-fiberglass laminate or a phenol-formaldehyde condensate [Bakelite]) is coated with a photosensitive resist, then dried. The positive film of the circuit is then superimposed over the resist and exposed through an arc lamp. Thereafter the unexposed resist which corresponds to the circuit pattern is removed by development, baring the circuit. The circuit, including terminal pads, plug-in terminals, etc., is then gold plated to prevent the copper from tarnishing and otherwise to protect the copper against a corrosive environment, after which the hardened resist is stripped from the board and the unwanted copper in the copper layer is etched away. During the etching step the gold plate serves as a maskant for the desired underlying circuit pattern, protecting same.

However, serious questions have been raised about the advisability of gold plate on the terminal pads, particularly for the aerospace applications wherein a high level of reliability is essential. Assembly of the etched circuit boards into the overall unit normally involves soldering connections to the gold plated terminals. Tests have shown that gold has a tendency to dissolve in the solder and form a brittle tin-gold intermetallic compound. The strength of the solder joint seems to decrease as the gold content of the gold-solder solution increases, creating a particularly harmful effect when the gold electrodeposits exceed a thickness of 1.25$\mu$ (0.00005 inch).

When a requirement for gold-free soldered joints on gold plated etched circuit boards is made, it is not uncommon to mechanically remove the gold from the terminal pads by abrasion, i.e., erase with an electric eraser.

Aside even from the labor involved, this abrasion technique suffers from serious intrinsic disadvantages. Valuable gold is lost in the form of dust. Worst of all is the probability that the entire circuit will be destroyed by cutting through or tearing off the terminal pads, or a printed line is erased, or the copper at the terminal is abraded too thin for effective soldering, or holes are created in a conductor line or at a terminal pad. Among other advantages the present invention obviates the need for mechanical erasure of any gold plate.

The principal object of the present invention is to provide a technique for making etched circuit boards surfaced with different metals at the conductor lines and on the terminal pads thereof, thereby obviating need for mechanical erasure.

A further object of the invention is to provide a selective plating procedure wherein two or more diverse metals may be plated on an etched circuit board.

Further objects and advantages of the present invention will be apparent from the description thereof which follows.

Briefly stated the present invention provides a method of making an etched circuit board from a laminated structure having a thin layer of copper bonded to a sheet of insulating material by the following sequences:

The copper side of the laminate is coated with a photosensitive resist.

The resist is exposed under a positive film which pictures the conductor pattern.

The exposed resist is developed thereby exposing the copper paths of the conductor pattern.

A metallic coating is plated on the exposed conductor pattern, the plate usually being gold electroplate.

The hardened resist is removed from the copper layer.

Next the copper layer is a second time completely coated with a photo-sensitive resist.

This time the resist is exposed under a positive film which pictures only the terminal pad pattern associated with the circuit.

The resist is developed to expose thereby only the copper at the terminal pad pattern.

A different metal coating, e.g., solder plate, is plated on the terminal pad pattern.

Thereafter the hardened resist is removed.

Optionally present is a repetition of the selective plating step of once again coating the copper layer with a photo-sensitive resist, exposing the resist under a positive film of a portion of the circuit which, for example, may be the plug-in terminals on the circuit, developing the resist to expose printed portion, then (rhodium) plating the exposed areas, followed again by removing the hardened resist.

Lastly, the copper layer is coated for an additional time with a photo-sensitive resist.

This time the resist is exposed under a negative film of the entire circuit.

Subsequent development of the resist exposes the unplated portion of the copper layer leaving a hardened resist cover over all of the previously plated regions.

Then the exposed copper is etched away.

After etching the hardened resist may be left on the circuit pattern until the board is ready for soldering at which time it can be easily removed with a suitable solvent. Also, the board is now ready for its final cleaning after which it is trimmed and holes are drilled in the terminal pads for component leads.

As a particular advantage of the present invention, employment of a last coat of resist to cover the plated area during the course of etching the superfluous copper eliminates any need for selecting an etchant which will not attack any of the diverse plated materials. Also, since the electrodeposits themselves are not relied upon to act as maskants, the possibility of pinholes in the plate can be ignored. The copper beneath any pinholes will be protected from the etchant by the resist.

For further understanding of the present invention reference is now made to the attached drawing and to the following more detailed description posed in terms of exemplary practices thereof, wherein.

STEP I

Figure 1:
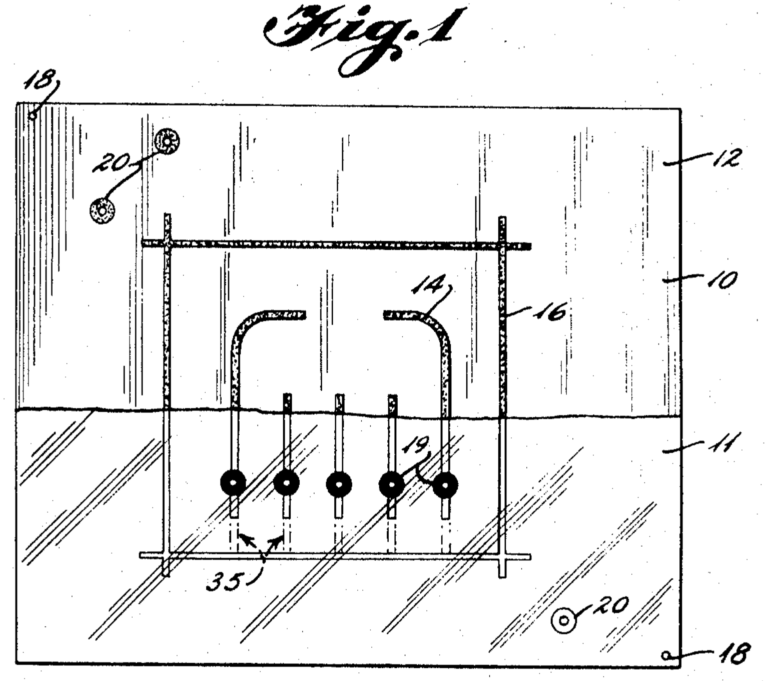
FIGURE 1 is a plan view of a printed circuit board as it appears at a mid point in the process showing the gold plated copper paths of the conductor pattern and in broken away partial view, showing the positive film of the terminal pad portion of the circuit superimposed thereover.

The first step of the present procedure is the art work and preparation of the films on a suitable scale, e.g., a 4 to 1 scale. For the art work a separate transparent sheet is employed for each metal to be plated on the copper layer of the circuit board. Ruled semi-transparent Mylar sheeting is a preferred material for the art work.

On one such clear sheet the terminal pads are laid out with black layout tape. On a second sheet the conductors are laid out with black layout tape. In the present exemplary circuit a third sheet is necessary, to lay out the plug-in terminals with black layout tape. The art work on the several sheets must, of course, be exactly to scale and in exact registry. Appropriate reference points or registry marks and positioning holes align the circuit component on each sheet into the overall circuit. Ultimately the same registry marks or reference points 20 and positioning holes 18 are placed also on the copper clad circuit board 10.

A separate positive film the same size as the circuit is made of the art work on each sheet. For brevity the positives of the conducts, the terminal pads, and the plug-in terminals will be referred to as positive A, B, C, respectively.

An alternative technique can be used when art work facilities or materials are not available. An existing film of the circuit can be employed as follows: first three duplicate negatives are made from the existing film; then on one negative the terminal pads and plug-in terminals are masked off and a positive film prepared from this masked off negative (having only the connectors); on another negative the connectors and plug-in terminals are masked off and a positive prepared showing only the terminal pads; lastly the terminal pads and connectors are masked off on the third negative and a positive made showing only the plug-in terminals. Again positives A, B, C and a negative of the entire circuit are available.

STEP II

The second step involves marking the circuit off on the circuit board 10 which typically is a fiberglass laminate surfaced with a thin copper layer 12 adhesively secured thereto. Such boards are widely available, e.g., Micaply (Mica Corporation), Textolite (General Electric), Panelyte (Panelyte Industrial Corporation).

As a preliminary, the several films are all superimposed in registry and at least one positioning hole 18 drilled therethrough, e.g., with a ⅛" drill. The same size drill is employed to place a positioning hole 18 on a fresh circuit board 10.

Precut predrilled boards 10 are cleaned suitably e.g., by degreasing with trichloroethylene or perchlorethylene, then cleaned with a fine abrasive and a mild acid dip. Thereafter the copper layer is coated with a photo resist material, e.g., Kodak resist manufactured by Eastman Kodak Corporation, and the resist layer dried. One of the positive films, say positive A is superimposed on the board 10 employing a Teflon pin in pilot holes 18, then exposed to an arclight for approximately two–three minutes, and thereafter developed in whatever fashion is recommended for the particular photo resist film. Thereby only the circuit conductor lines 14 are bared. The remainder of the copper layer 12 remains covered by hardened resist.

The so developed board 10 is immersed in a standard gold plating bath, e.g., the citric acid insoluble anode type, operated at 70° F., pH, 3.5–4, 1 oz. gold as metal per gallon, and a thin layer of gold (about 0.0001 inch) electroplated thereon. The gold plated board is rinsed, then placed in a suitable solvent bath (e.g., Unisol 199 supplied by the Telron Corporation) which removes the photo resist therefrom.

The procedure is then repeated. That is, the board is cleaned and coated with photo resist exposed under a (different) positive, then developed. However, this time positive B containing only the terminal pads and reference marks is superimposed on the circuit board in exact registry using alignment pin openings 18 and registry markings 20 in the manner shown in the partially broken away FIGURE 2, wherein 11 is film B. The boundary lines 16 for the completed circuit board were made part of positive A as were conductor lines 14.

After development of the exposed resist, the terminal pad portion of the printed circuit is bared so that when the board is plated according to standard plating practices with a different metal, e.g., is solder plated, only the terminal pad portions of the circuit are plated. Solder (60% tin—40% lead) may be electroplated from a fluoroboric acid solution containing 8 oz. tin as metal and 3.4 oz. lead per gallon using 60–40 tin-lead anodes operated at 70° F.

As before, the plated board is rinsed free of plating solution, then treated to remove the hardened resist, and the entire procedure repeated with positive C to nickel (0.0005") then rhodium plate the plug-in terminal portions of the circuit. Once again the plating solution is rinsed off and the board treated to remove the hardened resist.

Although it may well be appreciated that in many instances only two diverse metals are present on the surface of the printed circuit, the present exemplary circuit includes still additional metals, e.g., nickel and rhodium which will be at 35 on FIGURE 1, and there is no real limit to the number of diverse metals which may be plated on the copper layer in forming the completed circuit. Since the plated areas are otherwise protected during the final etch which completes formation of the circuit, relative solubility of the plated metal in the etchant does not become a limitation on the availability of any particular metal for the circuit.

STEP III

Figure 2:
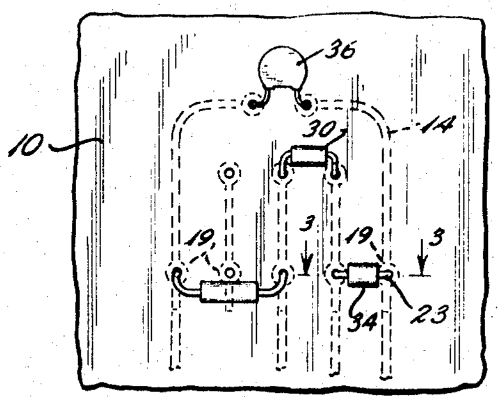
FIGURE 2 is an enlarged fragmentary plan view of the reverse side of an assembled etched circuit board.
Figure 3:
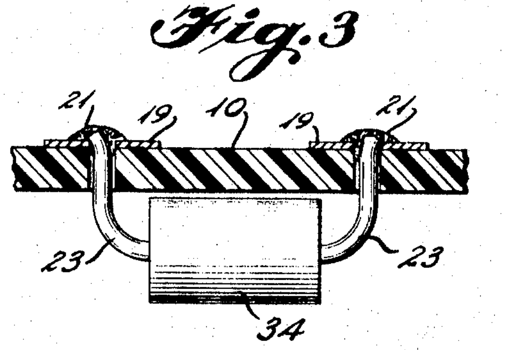
FIGURE 3 is a section through line 3—3 on FIGURE 2.

For the final time, the copper layer is coated with resist and the board is again set up for exposure, this time, however, the negative film of the entire circuit is superimposed over the board in proper registry using the pilot holes 18. Development of the exposed resist now bares the unplated copper layer but covers the completely plated circuit. The board is then etched, as for example by immersion for two to three minutes in a 42° Baumé ferric chloride solution, a treatment which will etch away all of the bared copper leaving behind the resist covered circuit. No reliance is placed on the plate over the circuit to act as an etch maskant. Actually the present procedure even contemplates leaving the resist on the board to protect the circuit until the terminal pads are to be soldered to component leads and then removing the resist only from the area to be soldered. Presence of such a resist coating over the circuit does not interfere with trimming the board along lines 16 and drilling holes through the terminal pads for component leads. FIGURES 2 and 3 show board 10 after components such as resistors 30, capacitors 36, and transistor diodes 34, have been incorporated into the etched circuit by soldering 21 leads 23 to terminal pads 19.

Mention has already been made that provision of a coat of resist over the plated areas during the etching process eliminates the need to select an etchant which will not attack any of the plated metals because the plated deposits do not themselves have to act as maskants. As an added advantage the problem of pin holes in the plating becomes almost immaterial because those portions of the circuit underlying the pin holes are protected from the etchant by the resist.

While the above description has been specific to plating of specific metals on different areas of the circuit and to the use only of circuitry on one side of a board, it should be readily apparent, however, that the process may be extended to employment of both sides of the board as well as to plating in any fashion as many different metals as described in any particular circuit. Numerous variations in the procedure may be readily devised by those skilled in the art within the spirit and scope of this invention.

What is claimed is:

1. The method of making an etched circuit board from a laminated structure having a layer of copper bonded to a sheet of insulating material which comprises the following sequence:

(a) coating the copper side of said laminate with a photosensitive resist, exposing the resist under a positive film of a conductor pattern, developing the resist whereby only the copper paths of the conductor pattern are exposed, then plating a metallic coating on the exposed conductor pattern, thereafter removing the hardened resist;

(b) coating the copper a second time with a photosensitive resist, exposing the resist under a positive film of the terminal pad pattern associated with the conductor pattern, developing the resist whereby only the copper at the terminal pad pattern is exposed, then plating a metallic coating on the exposed terminal pad portion, the metallic coating being different from the metallic coating on the conductor pattern, thereafter removing the hardened resist;

(c) coating the copper a third time with a photosensitive resist, exposing the resist under a negative film of the entire circuit, developing the resist whereby the unplated portion of the copper layer is exposed, leaving resist over the previously plated areas, then etching the exposed copper away.

2. The process of claim 1 wherein the procedure of steps (a) and (b) is followed to plate still a third and different metallic coating on selected portions of the copper.

3. The process of claim 1 wherein steps (a) and (b) are reversed.

4. The process of claim 1 wherein the conductor paths are gold plated and the terminal pads are solder plated.

5. The process of claim 2 wherein the conductor paths are gold plated, the terminal pads are solder plated, and plug-in terminals are nickel and rhodium plated.

6. The process of claim 1 wherein each positive film is prepared from art work of the appropriate circuit portion done on an enlarged scale.

7. The process of claim 1 wherein each positive film is prepared by masking off all but the desired circuit portion on a negative film of the entire circuit.

References Cited

UNITED STATES PATENTS

| | | | |
|---|---|---|---|
| 2,958,928 | 11/1960 | Bain et al. | 29—155.5 |
| 3,297,442 | 1/1967 | Spiers | 96—36.2 |
| 3,169,063 | 2/1965 | Johnston et al. | 96—27 |

JACOB H. STEINBERG, Primary Examiner

U.S. Cl. X.R.

29—625; 96—36.2; 156—11; 204—15